United States Patent
Chen et al.

(10) Patent No.: US 7,288,827 B2
(45) Date of Patent: Oct. 30, 2007

(54) SELF-ALIGNED MASK FORMED UTILIZING DIFFERENTIAL OXIDATION RATES OF MATERIALS

(75) Inventors: Huajie Chen, Wappingers Falls, NY (US); Kathryn T. Schonenberg, Wappingers Falls, NY (US); Gregory G. Freeman, Hopewell Junction, NY (US); Andreas D. Stricker, Essex Junction, VT (US); Jae-Sung Rieh, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 10/969,718

(22) Filed: Oct. 20, 2004

(65) Prior Publication Data
US 2005/0079726 A1 Apr. 14, 2005

Related U.S. Application Data

(62) Division of application No. 10/345,469, filed on Jan. 15, 2003, now Pat. No. 6,844,225.

(51) Int. Cl.
*H01L 27/082* (2006.01)
*H01L 27/102* (2006.01)
(52) U.S. Cl. ........................ 257/565; 257/517
(58) Field of Classification Search ............. 257/183, 257/194, 511, 518, 525, 552, 565, 517
See application file for complete search history.

(56) References Cited

U.S. PATENT DOCUMENTS 4,717,678 A 1/1988 Goth (Continued)

FOREIGN PATENT DOCUMENTS

GB 2081507 A 2/1982
JP 06-260490 9/1994

OTHER PUBLICATIONS

Method of forming a substrate contact for a bipolar memory cell (Apr. 1985) IBM Technical Disclosure Bulletin.

*Primary Examiner*—Theresa Doan
(74) *Attorney, Agent, or Firm*—Joseph P. Abate, Esq.; Scully, Scott, Murphy & Presser, PC

(57) ABSTRACT

A self-aligned oxide mask is formed utilizing differential oxidation rates of different materials. The self-aligned oxide mask is formed on a CVD grown base NPN base layer which compromises single crystal Si (or Si/SiGe) at active area and polycrystal Si (or Si/SiGe) on the field. The self-aligned mask is fabricated by taking advantage of the fact that poly Si (or Si/SiGe) oxidizes faster than single crystal Si (or Si/SiGe). An oxide film is formed over both the poly Si (or Si/siGe) and the single crystal Si (or Si/siGe) by using an thermal oxidation process to form a thick oxidation layer over the poly Si (or Si/siGe) and a thin oxidation layer over the single crystal Si (or Si/siGe), followed by a controlled oxide etch to remove the thin oxidation layer over the single crystal Si (or Si/siGe) while leaving the self-aligned oxide mask layer over the poly Si (or Si/siGe). A raised extrinsic base is then formed following the self-aligned mask formation. This self-aligned oxide mask blocks B diffusion from the raised extrinsic base to the corner of collector.

4 Claims, 3 Drawing Sheets

U.S. PATENT DOCUMENTS

| | | |
|---|---|---|
| 4,728,618 A | 3/1988 | Hirao |
| 4,745,086 A | 5/1988 | Parrillo et al. |
| 5,019,534 A | 5/1991 | Tsai et al. |
| 5,128,271 A | 7/1992 | Bronner et al. |
| 5,268,314 A | 12/1993 | Conner |
| 5,399,513 A | 3/1995 | Liou et al. |
| 5,480,815 A * | 1/1996 | Watanabe .................. 438/365 |
| 5,633,179 A | 5/1997 | Kamins et al. |
| 6,022,768 A | 2/2000 | Peidous |
| 6,271,575 B1 | 8/2001 | Peidous |
| 6,649,482 B1 * | 11/2003 | Naem ........................ 438/361 |
| 6,689,211 B1 | 2/2004 | Wu et al. |

\* cited by examiner

Two Materials with Different Oxidation Rate

Oxidation

Controlled Oxide Etch Leaves a Self-Aligned Mask

SELF-ALIGNED MASK FORMED UTILIZING DIFFERENTIAL OXIDATION RATES OF MATERIALS

CROSS REFERENCE TO RELATED APPLICATION:

The present application is a divisional of application Ser. No. 10/345,469 filed on Jan. 15, 2003, now U.S. Pat. No. 6,844,225 the entire contents of which is incorporated herein by its reference.

BACKGROUND OF THE INVENTION

The present invention relates generally to a self-aligned mask formed utilizing differential oxidation rates of different materials, and more particularly to a method for forming a self-aligned oxide mask on a polycrystal field of a base layer of a CVD grown base NPN transistor wherein the base layer compromises single crystal Si (or Si/SiGe-which means a layer of single crystal silicon on top of a layer of single crystal silicon germanium) at active area and polycrystal Si (or Si/SiGe-which means a layer of polycrystal silicon on top of a layer of polycrystal silicon germanium) on the field isolation.

SUMMARY OF THE INVENTION

Accordingly, it is a primary object of the present invention to provide a self-aligned mask formed by utilizing differential oxidation rates of different materials. A self-aligned oxide mask is formed on a CVD grown base NPN transistor base layer which comprises single crystal Si (or Si/SiGe) at an active area and polycrystal Si (or Si/SiGe) on the surrounding field, which is followed by the formation of a raised extrinsic base. This self-aligned mask is fabricated by taking advantage of the fact that poly Si (or Si/SiGe) oxidizes faster than single crystal Si (or Si/SiGe). In addition, the fact that SiGe oxidizes faster than Si, and doped Si (or SiGe) oxidizes faster than intrinsic Si (or SiGe) can also be utilized to form the self-aligned mask. An oxide film is formed over both the poly Si (or Si/SiGe) and the single crystal Si (or Si/SiGe) by using a thermal oxidation process to form a thick oxide layer over the poly Si (or Si/SiGe) and a thin oxide layer over the single crystal Si (or Si/SiGe). This is followed by a controlled oxide etch to remove the thin oxide layer over the single crystal Si (or Si/SiGe) while leaving an oxide mask layer over the poly Si (or Si/SiGe) which blocks B diffusion from the highly doped raised extrinsic base to the corner of the collector.

BRIEF DESCRIPTION OF THE DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

Figure 1:
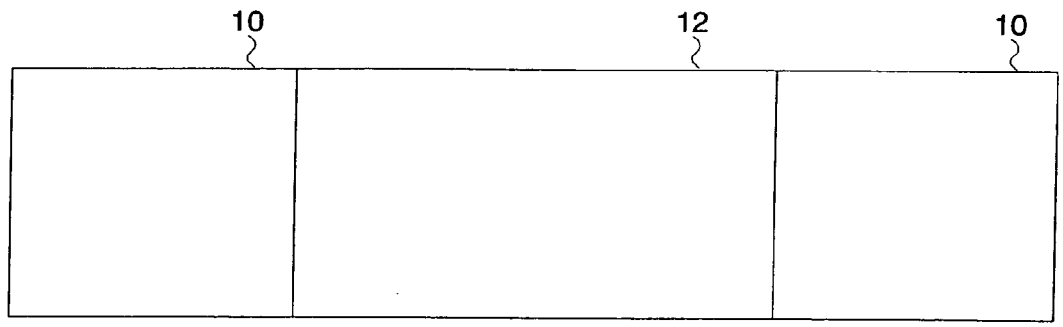
FIG. 1 illustrates a structure composed of first and second different materials with different oxidation rates, a first fast oxidation rate for the first material and a second slower oxidation rate for the second material.

FIG. 1 illustrates a structure composed of first and second different materials 10,12 with different oxidation rates, a first fast oxidation rate for the first material and a second slower oxidation rate for the second material.

Figure 2:
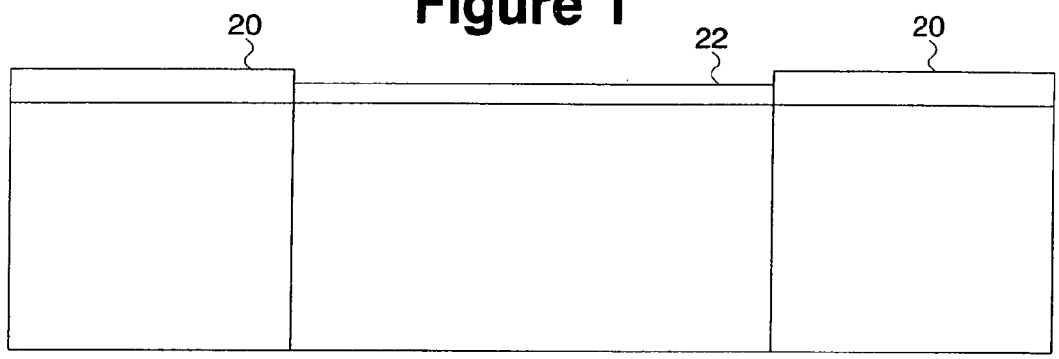
FIG. 2 illustrates the structure of FIG. 1 after oxidation of the two different materials at the two different oxidation rates, which shows a thick oxide layer over the first material and a thin oxide layer over the second material.

FIG. 2 illustrates the structure of FIG. 1 after oxidation of the two different materials at the two different oxidation rates, which shows a thick oxide layer 20 over the first material and a thin oxide layer 22 over the second material.

Figure 3:
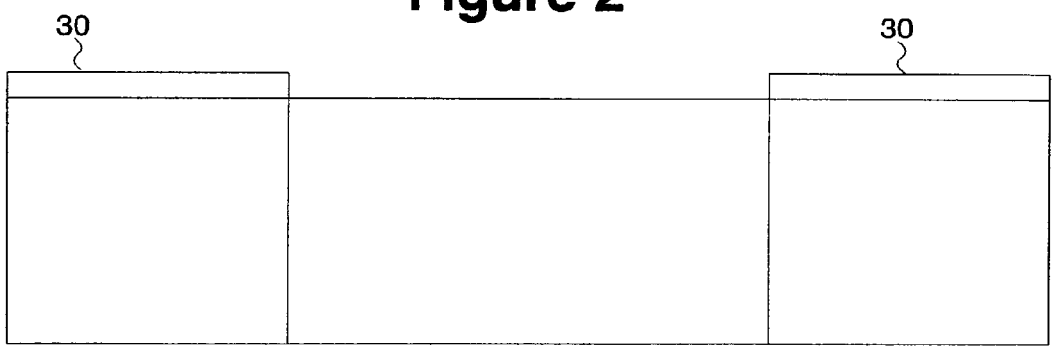
FIG. 3 illustrates the structure after a controlled oxide etch which etches both oxide layers at approximately the same rate, such that after the second oxide layer is completely etched, a self-aligned mask remains over the first material.

FIG. 3 illustrates the structure after a controlled oxide etch which etches both oxide layers at approximately the same rate, such that after the second oxide layer is completely etched, a self-aligned mask 30 remains over the first material.

The present invention uses this principle to form a self-aligned oxide mask on a CVD grown base NPN transistor base layer which comprises single crystal Si (or Si/SiGe) at an active area and polycrystal Si (or Si/SiGe) on the surrounding field. This self-aligned mask is fabricated by taking advantage of the fact that poly Si (or Si/SiGe) oxidizes faster than single crystal Si (or Si/SiGe). An oxide film is formed over both the poly Si (or Si/SiGe) and the single crystal Si (or Si/SiGe) by using an oxidation process to form a thick oxide layer over the poly Si (or Si/SiGe) and a thin oxide layer over the single crystal Si (or Si/SiGe). A HIPOX (HIgh Pressure OXidation) process is used for reduced total thermal cycle due to its faster oxidation rate, but the invention is not limited to HIPOX.

The oxidation process is then followed by a controlled oxide etch to remove the thin oxidation layer over the single crystal Si (or Si/SiGe) while leaving an oxide mask layer over the poly Si (or Si/SiGe) which blocks B diffusion from the highly doped raised extrinsic base to the corner of the collector.

Figure 4:
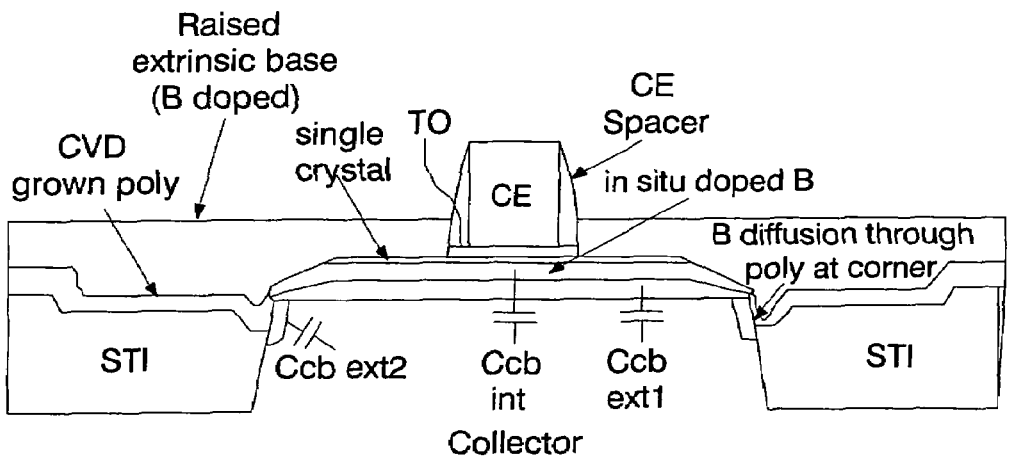
FIG. 4 illustrates a prior art CVD grown base NPN transistor having a raised extrinsic base construction which is used for an HBT (heterojunction bipolar transistor) base contact.

FIG. 4 illustrates a prior art CVD grown base NPN transistor having a B (boron) doped raised extrinsic base construction which is now used for HBT (heterojunction bipolar transistor) base contact [B. Jagannathan et al., "Self-aligned SiGe NPN transistors with 285 GHz fMAX and 207 GHz fT in a manufacturable technology", IEEE Electron Device Lett. 23, 258 (2002)]. The device comprises a collector, a highly B doped raised extrinsic base contact, an in situ B doped single crystal base layer, and a central emitter CE with CE spacers separating emitter and extrinsic base, with the device being isolated by shallow trench isolation STI on each side. Its advantage compared to a CVD grown base NPN transistor having an implanted base [S. Jeng et al., "Impact of extrinsic base process on NPN HBT performance and polysilicon resistor in integrated SiGe HBTs", Proceedings of 1997 BCTM, P. 187-190], is that it reduces the total base-collector capacitance Ccb, which helps to achieve an extremely high fMAX [B. Jagannathan et al., "Self-aligned SiGe NPN transistors with 285 GHz fMAX and 207 GHz fT in a manufacturable technology", IEEE Electron Device Lett. 23, 258 (2002)].

At a side corner 50 of the device, STI oxide is pulled down during a pre-CVD HF (hydrofluoric acid) etch, which is necessary for high quality CVD film growth. The side corner 50 is then filled with poly Si (or Si/SiGe). This introduces a fast corner diffusion path for B from the raised extrinsic base to diffuse into the collector, and causes an additional base-collector capacitance Ccb ext2.

FIGS. 4-7 illustrate the structure after the raised extrinsic base formation, and CE is an emitter pedestal, which will be opened in a later process and emitter poly will be deposited in the opening. Since the emitter process is not directly related to this invention, the details of the emitter process are omitted here. Several options of emitter processes can be adopted, one example is an emitter self-aligned to the extrinsic base as described by prior art [B. Jagannathan et al., "Self-aligned SiGe NPN transistors with 285 GHz fMAX and 207 GHz fT in a manufacturable technology", IEEE Electron Device Lett. 23, 258 (2002)], but this invention is not limited to this specific emitter process.

The present invention provides a method for eliminating the corner diffusion path for B to reduce the total Ccb of the device. The inventive method leaves an oxide layer in between the raised extrinsic base and the CVD grown poly Si (or Si/SiGe), which blocks B diffusion from the raised extrinsic base, as shown in FIG. 5.

Figure 5:
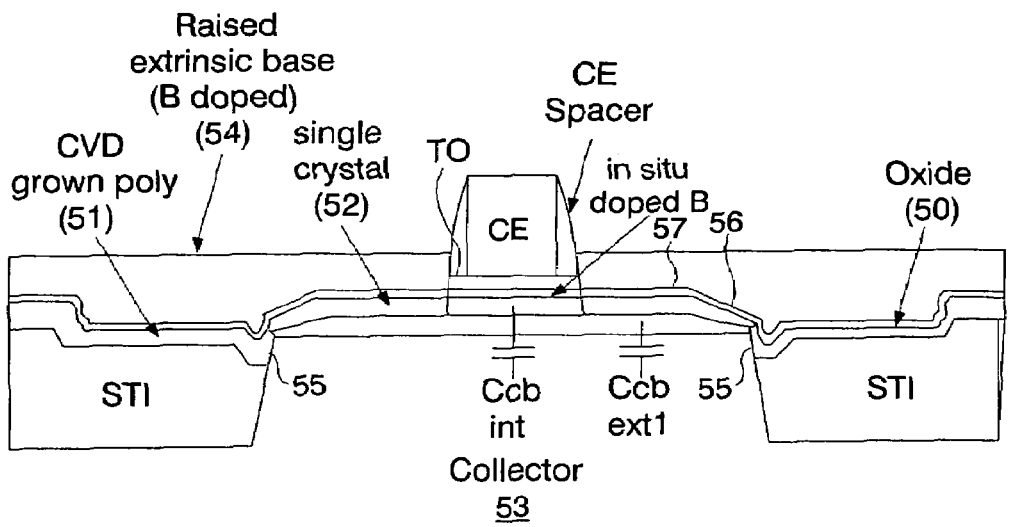
FIG. 5 shows a CVD grown base NPN transistor similar to FIG. 4, wherein pursuant to the present invention an oxide layer is formed over poly Si (or Si/SiGe) on the field around a central single crystal Si (or Si/SiGe) of the base.

FIG. 5 shows a CVD grown base NPN transistor similar to FIG. 4, wherein pursuant to the present invention an oxide layer 50 is formed over the poly Si (or Si/SiGe) 51 on the field around the central single crystal Si (or Si/SiGe) base 52. The device comprises a collector 53, a B doped raised extrinsic base contact 54, an in situ B doped single crystal base layer 52, and a central emitter CE (to be formed later) with CE spacers separating the emitter and the extrinsic base 54, with the device being isolated by shallow trench isolation STI on each side. At a side edge corner 55 of the device, STI oxide is pulled down during a pre-CVD HF etch, which is necessary for high quality CVD film growth. The side edge corner 55 is then filled with poly Si (or Si/SiGe).

Pursuant to the present invention, the self-aligned mask is fabricated by taking advantage of the fact that poly Si (or Si/SiGe) oxidizes faster than single crystal Si (or Si/SiGe). An oxide film is formed over both the poly Si (or Si/SiGe) 51 and the single crystal Si (or Si/SiGe) 52 by using a thermal oxidation process to form a thick oxide layer over the poly Si (or Si/SiGe) and a thin oxidation layer over the single crystal Si (or Si/SiGe).

The oxidation process is followed by a controlled oxide etch to remove the thin oxide layer over the single crystal Si (or Si/SiGe) 52 while leaving an oxide mask layer 50 over the poly Si (or Si/SiGe) 51. This oxide mask blocks B diffusion from the raised extrinsic base through the side edge corner 55 to the collector.

The oxide layer is also initially formed thicker on the single crystal facet face 56 than on the (100) face 57, which is due to the higher oxidation rate of the single crystal facet face compared to the (100) face, such that after the controlled etch, an oxide mask layer also remains over the single crystal facet face.

The differential oxidation between poly and single crystal can be further enhanced by the fact that SiGe oxidizes faster than Si, and doped Si (or SiGe) oxidizes faster than intrinsic Si (or SiGe). For example, if the base layer comprises a SiGe layer followed by an intrinsic Si cap layer, and oxidation thickness is chosen properly so that in the single crystal area oxidation is limited to the top intrinsic Si cap of base layer, and oxidation in the polycrystal area consumes all the intrinsic Si cap and further oxidizes SiGe underneath the Si cap. Faster oxidation rate in SiGe further enhances the differential oxidation. B doping in the base layer beneath an intrinsic Si cap works similarly as SiGe discussed above.

The present invention reduces or eliminates Ccb ext2, which is caused by B diffusion through the poly at the side edge corner 55. Ccb ext2 is significant because the doping concentration in the collector is higher when it's deeper (closer to the subcollector).

In the above example, STI oxide at the side edge corner 55 of the device is pulled down during pre-CVD HF etch, and that corner is then filled with poly Si (or Si/SiGe) during the CVD process. However, the present invention will still work and help to reduce Ccb even when there is no such pull down, as illustrated in FIG. 6 and FIG. 7.

Figure 6:
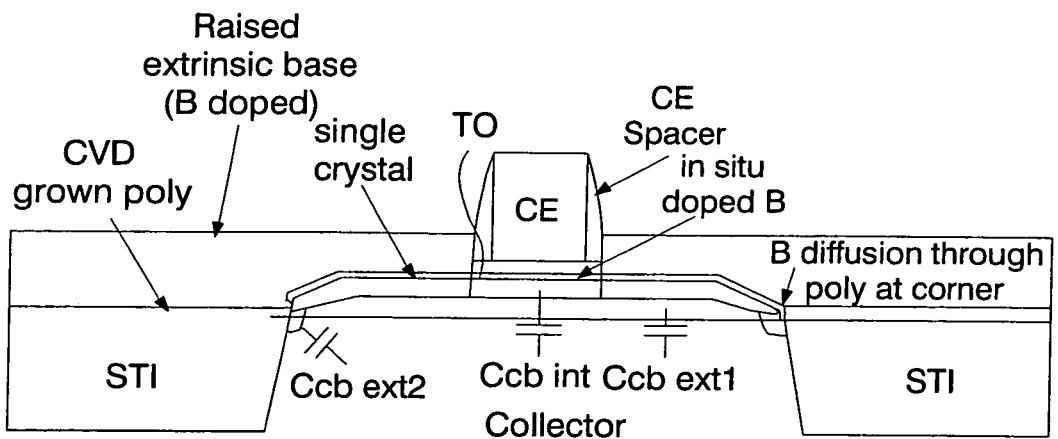
FIG. 6 illustrates a prior art CVD grown base NPN transistor similar to FIG. 4, without the oxide pull down at the side edge of the STI.

FIG. 6 illustrates a prior art CVD grown base NPN transistor similar to FIG. 4, but without the oxide pull down (similar to 55) at the side edge of the STI.

High concentration dopant in the extrinsic base still sees a fast diffusion path of poly Si (or Si/SiGe) near the edge of single crystal Si (or Si/SiGe). The dopant diffuses to the side of single crystal area and causes additional Ccb. A self-aligned mask formed over poly Si (or Si/SiGe) area blocks this diffusion path, as illustrated in FIG. 7.

Figure 7:
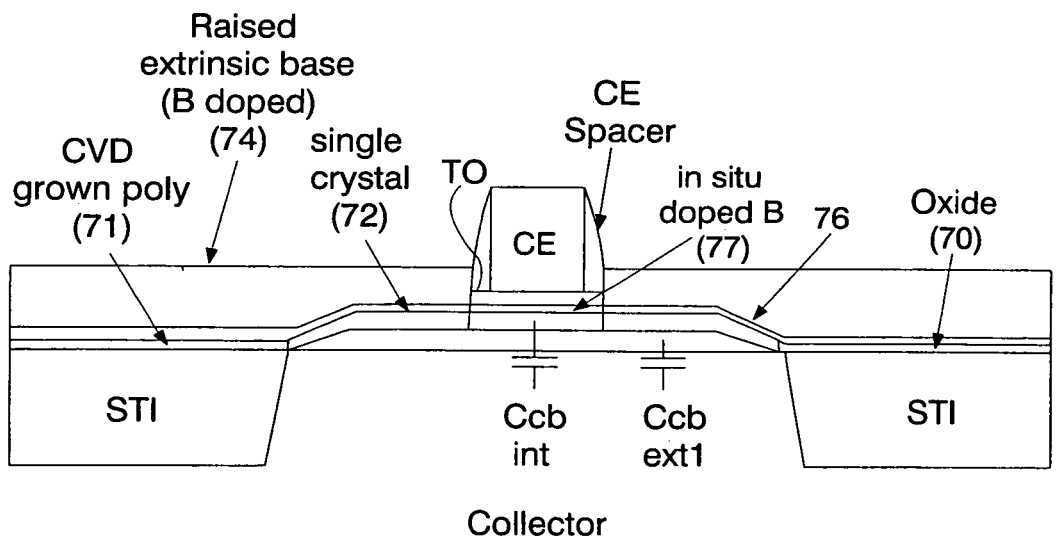
FIG. 7 shows a CVD grown base NPN transistor similar to FIG. 6, wherein pursuant to the present invention an oxide layer is formed over the poly Si (or Si/SiGe) on the field around a central single crystal Si (or Si/SiGe) of the base.

FIG. 7 shows a CVD grown base NPN transistor similar to FIG. 6, wherein pursuant to the present invention an oxide layer 70 is formed over the poly Si (or Si/SiGe) 71 on the field around the central single crystal Si (or Si/SiGe) base 72. The device comprises a collector 73, a B doped raised extrinsic base contact 74, an in situ B doped single crystal base layer 72, and a central emitter CE (to be formed later) with CE spacers separating the emitter and the extrinsic base 74, with the device being isolated by shallow trench isolation STI on each side.

Pursuant to the present invention, the self-aligned mask is fabricated by taking advantage of the fact that poly Si (or Si/SiGe) oxidizes faster than single crystal Si (or Si/SiGe). An oxide film is formed over both the poly Si (or Si/SiGe) 71 and the single crystal Si (or Si/SiGe) 72 by using a thermal oxidation process to form a thick oxide layer over the poly Si (or Si/SiGe) and a thin oxidation layer over the single crystal Si (or Si/SiGe).

The oxide layer is also initially formed thicker on the single crystal facet face 76 than on the (100) face 77, which is due to the higher oxidation rate of the single crystal facet face compared to the (100) face, such that after the controlled etch, an oxide mask layer also remains over the single crystal facet face The oxidation process is followed by a controlled oxide etch to remove the thin oxide layer over the single crystal Si (or Si/SiGe) 72 while leaving an oxide mask layer 70 over the poly Si (or Si/SiGe) 71. This oxide mask blocks B diffusion from the raised extrinsic base to the collector.

In addition, it's easy to see that the STI is not essential for the present invention to work.

While several embodiments and variations of the present invention for a self-aligned mask formed utilizing differential oxidation rates of materials are described in detail herein, it should be apparent that the disclosure and teachings of the present invention will suggest many alternative designs to those skilled in the art.

Having thus described our invention, what we claim as new and desire to secure by Letters Patent is:

1. A transistor comprising:
   a collector, an emitter, and a composite base which includes a polycrystal Si on a field oxide and a single crystal Si at an active area; and
   a self-aligned oxide mask layer formed over the polycrystal Si followed by a raised extrinsic base formation, which self-aligned oxide mask blocks dopant diffusion from the raised extrinsic base through the polycrystal Si at an edge of the collector to the collector to reduce a base-collector capacitance.

2. The transistor of claim 1, wherein the self-aligned oxide layer is also formed on a single crystal facet face of the single crystal Si.

3. The transistor of claim 2, wherein a side edge portion of an isolation oxide adjacent to the collector is pulled down during a pre-CVD HF etch and then filled with the polycrystal Si, and the self-aligned oxide mask blocks a diffusion path for a B (boron) dopant from the raised extrinsic base to diffuse through the side edge portion into the collector.

4. The transistor of claim 1, wherein a side edge portion of an isolation oxide adjacent to the collector is pulled down during a pre-CVD HF etch and then filled with the polycrystal Si, and the self-aligned oxide mask blocks a diffusion path for a B (boron) dopant from the raised extrinsic base contact to diffuse through the side edge portion into the collector.

* * * * *